(12) United States Patent
Napoles et al.

(10) Patent No.: US 8,948,706 B2
(45) Date of Patent: Feb. 3, 2015

(54) STICTION REDUCTION FOR MEMS DEVICES

(71) Applicant: Motorola Mobility LLC, Libertyville, IL (US)

(72) Inventors: Adrian Napoles, Lake Villa, IL (US); Vijay L. Asrani, Round Lake, IL (US); Gregory R. Black, Vernon Hills, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 243 days.

(21) Appl. No.: 13/706,913

(22) Filed: Dec. 6, 2012

(65) Prior Publication Data

US 2014/0159779 A1 Jun. 12, 2014

(51) Int. Cl.
*H04B 1/38* (2006.01)
*H03K 3/01* (2006.01)
*B81C 1/00* (2006.01)
*H03H 7/40* (2006.01)
(Continued)

(52) U.S. Cl.
CPC .............. *H03K 3/01* (2013.01); *B81C 1/00976* (2013.01); *H03H 7/40* (2013.01); *H01H 2059/0018* (2013.01); *H01H 2059/0063* (2013.01); *H03H 2007/006* (2013.01); *H03H 2007/008* (2013.01); *H03H 2007/386* (2013.01)
USPC ......................................................... 455/73

(58) Field of Classification Search
CPC ....................... B81C 1/00976; H03H 2007/006
USPC .............. 455/73, 333, 41.1, 262, 428, 78, 83; 327/111; 324/415
See application file for complete search history.

(56) References Cited

U.S. PATENT DOCUMENTS 6,876,046 B2   4/2005   Prophet
7,834,829 B2   11/2010   Martin et al.
(Continued)

FOREIGN PATENT DOCUMENTS

JP   2007335372 A   12/2007

OTHER PUBLICATIONS

Yamazaki et al.: "An intelligent bipolar actuation method with high stiction immunity for RF MEMS capacitive switches and variable capacitors", Sensors and Actuators A, Elsevier, vol. 139, No. 1-2, Aug. 29, 2007, pp. 233-236.
(Continued)

*Primary Examiner* — Eugene Yun
(74) *Attorney, Agent, or Firm* — Faegre Baker Daniels LLP (57) ABSTRACT

A capacitive micro-electromechanical switch (MEMS) integrated circuit (IC) comprises a plurality of capacitors, each having a voltage terminal for applying an actuation voltage to the individual capacitor, wherein each capacitor is capable of being individually cycled. The MEMS IC further includes: a high voltage driver having a voltage distribution mechanism that couples to the voltage terminal of each of the plurality of capacitors to enable the high voltage driver to selectively provide a pre-determined voltage input required to actuate and charge a selected one or more of the plurality of capacitors; and control logic communicatively coupled to the high voltage driver and which deterministically applies power cycle times (less than a stiction limit) for an actuation and de-actuation of at least a first capacitor of the plurality of capacitors to substantially reduce an occurrence of stiction within at least the first capacitor during operation of the MEMS device.

20 Claims, 5 Drawing Sheets

(51) Int. Cl.
  *H01H 59/00* (2006.01)
  *H03H 7/00* (2006.01)
  *H03H 7/38* (2006.01)

(56) References Cited

U.S. PATENT DOCUMENTS

| | | |
|---|---|---|
| 2004/0009754 A1 | 1/2004 | Smith |
| 2005/0057399 A1 | 3/2005 | Kipnis et al. |
| 2008/0094149 A1 | 4/2008 | Brobston |
| 2009/0002069 A1 | 1/2009 | Furuta et al. |
| 2009/0111267 A1 | 4/2009 | Park et al. |
| 2009/0231220 A1 | 9/2009 | Zhang et al. |

OTHER PUBLICATIONS

Lukas Mol et al.: "Full-Gap Positioning of Parallel-Plate Electrostatic MEMS Using On-off Control", IEEE Industrial Electronics, 2007, Jun. 2007, pp. 1464-1468.

Patent Cooperation Treaty, International Search Report and Written Opinion of the International Searching Authority for International Application No. PCT/US2013/071813, Feb. 25, 2014, 18 pages.

STICTION REDUCTION FOR MEMS DEVICES

BACKGROUND

1. Technical Field

The present invention generally relates to micro-electromechanical systems (MEMs) devices and in particular to reduction of stiction within MEMs devices.

2. Description of the Related Art

Micro-Electro-Mechanical System (MEMS) devices find applications in a variety of fields, such as communications, sensing, optics, micro-fluidics, and measurements of material properties. In the field of communications, variable MEMS capacitors are used in tunable RF filter circuits. The MEMS capacitors offer several advantages over solid state semiconductor-based switched capacitor banks and varactor diodes, including a higher on/off capacitance ratio and a higher Quality (Q) factor. In addition, MEMS devices offer greater linearity compared to their solid state counterparts, which reduces intermodulation products when used in Radio Frequency (RF) applications.

Many of these MEMS devices comprise a beam or microstructure suspended above a substrate by one or more supports. In a variable MEMS capacitor, for example, the beam may be suspended above a bottom electrode on the substrate to form a capacitor with the beam acting as the top electrode. The capacitance of the variable MEMS capacitor is varied by establishing an electrostatic force between the beam and the bottom electrode. The electrostatic force bends the beam relative to the bottom electrode, thereby changing the gap between the beam and the bottom electrode and, therefore, the capacitance of the MEMS capacitor.

A problem in MEMS devices is permanent adhesion of the beam or microstructure to the underlying substrate. This phenomenon is commonly referred to as "stiction". Stiction typically occurs when a beam or other microstructure is brought into intimate contact with the substrate. Once in contact, adhesion forces, e.g., Van der Waals force and/or hydrogen bonding, on the surface of the substrate exceed the elastic restoring force of the beam. As a result, the beam remains stuck to the substrate, rendering the MEMS device unusable.

BRIEF DESCRIPTION OF THE DRAWINGS

The disclosure will best be understood by reference to the following detailed description of illustrative embodiments when read in conjunction with the accompanying drawings, wherein.

DETAILED DESCRIPTION

The illustrative embodiments provide a method for reducing stiction and extending an effective life of capacitors within a micro-electromechanical Switch (MEMS) device containing a plurality of capacitors. Also provided are a capacitive micro-electromechanical switch (MEMS) integrated circuit (IC) and a communication device employing the MEMS IC. According to one embodiment, the MEMS IC includes a plurality of capacitors, each having a voltage terminal for applying an actuation voltage to the individual capacitor, wherein each capacitor is capable of being individually cycled. The MEMS IC further includes: a high voltage driver having a voltage distribution mechanism that couples to the voltage terminal of each of the plurality of capacitors to enable the high voltage driver to selectively provide a pre-determined voltage input required to actuate and charge a selected one or more of the plurality of capacitors; and control logic communicatively coupled to the high voltage driver and which deterministically applies power cycle times (less than a stiction limit) for an actuation and de-actuation of at least a first capacitor of the plurality of capacitors to substantially reduce an occurrence of stiction within at least the first capacitor during operation of the MEMS device.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general disclosure.

Figure 1:
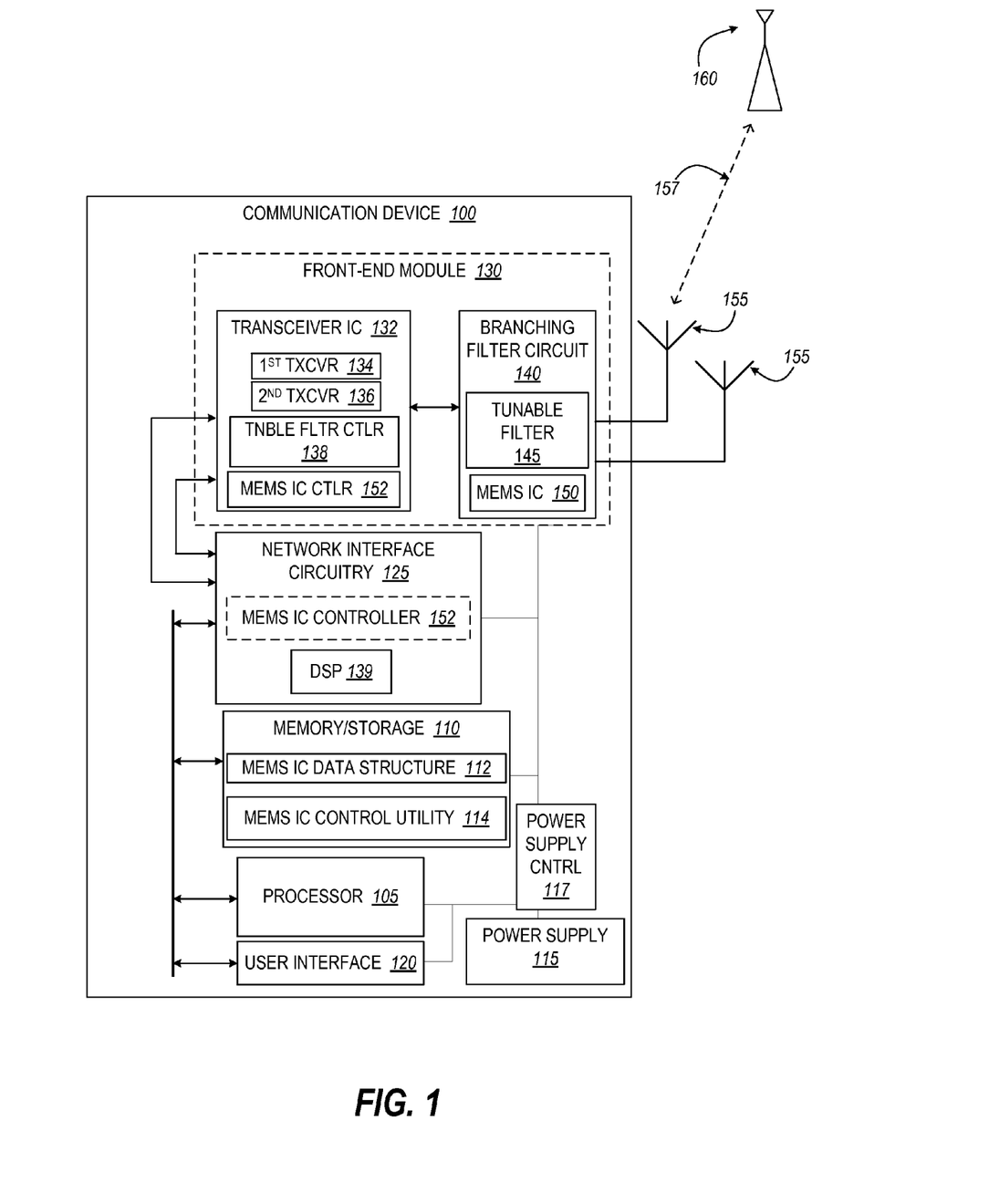
FIG. 1 provides a block diagram representation of an example communication device having a front end transceiver module that utilizes a micro-electromechanical switch (MEMS) integrated circuit (IC) and within which the various features of the disclosure can be advantageously implemented, according to one embodiment.

With reference now to the figures, and beginning with FIG. 1, there is depicted a block diagram representation of an example communication device 100 operating within a wireless communication network, generally represented by an example base station 160. As presented herein, base station 160 and communication device 100 can both support multiple communication protocols and/or multiple radio access technologies that allow for simultaneous transmission and simultaneous reception of signals from/to communication device 100.

Communication device 100 can be one of and be referred to as a system, device, subscriber unit, subscriber station, mobile station (MS), mobile, mobile device, remote station, remote terminal, access terminal, user terminal, terminal, endpoint, communication device, user agent, user device, user equipment (UE), cellular telephone, a satellite phone, a cordless telephone, a wired telephone, a Session Initiation Protocol (SIP) phone, a wireless local loop (WLL) station, a personal digital assistant (PDA), a handheld device having wireless or wired connection capability, a computing device, such as a laptop, tablet, smart phone, personal digital assistant, or other processing devices connected to a modem. Communication device 100 comprises processor 105 which is connected to a storage device, such as memory 110 via a bus interface. Processor 105 can represent one or more programmable microprocessors, such as a data processor and a digital signal processor (DSP). Processor 105 controls the communication and other functions and/or operations of the communication device 100. These functions and/or operations can include, but are not limited to, application data processing and signal processing.

Memory 110 can include volatile memory and/or non-volatile memory. One or more applications can be stored within memory and executed by a processor on processor IC 105. For example, memory 110 is illustrated as having MEMS IC data structure 112 and MEMS IC control utility 114. The associated functionality and/or usage of both software/data modules will be described in greater detail within the descriptions which follow.

Communication device 100 can also comprise one or more user interface devices 120, including one or more input devices, such as a keypad, touch screen, touch pad, and microphone, and/or one or more output devices, such as speaker, haptic interface, display and others. Communication device 100 also comprises network interface circuitry 125 and front-end module 130. As shown, network interface circuitry 125 can include a DSP 139 and optionally include MEMS IC controller 152. Front-end module 130 generally includes transceiver IC 132 and branching filter circuit 140. Branching filter circuit 140 includes tunable filter 145 and MEMS IC 150. In at least one embodiment, MEMS IC 150 is a component within tunable filter 145, although MEMS IC 150 can be separate from tunable filter 145 but configured to provide required capacitance to tunable filter 145 via one or more capacitors within MEMS IC 150. Transceiver IC 132 is illustrated including first transceiver 134, second transceiver 136, tunable filter controller 138, and MEMS IC controller 152. The functionality of these controllers will be described in detail later.

Communication device 100 also comprises a power supply 115, which is illustrated as being local and/or internal to communication device 100. Power supply 115 has an associated power supply controller 117, which provides power to each of the various functional components within communication device 100 via a power supply network. It is appreciated that in alternate embodiments, power supply 115 can be external to communication device 100 and/or that communication device 100 can be powered by an external cable connected via a Micro/Mini USB port, for example. Within the described embodiments, one or more capacitors on MEMS IC 150 are powered by a voltage input that is a product of power supply 115.

Communication device 100 also comprises at least one antenna 155 coupled to branching filter circuit 140. Two antennas 155 are shown to allow for simultaneous signal transmission via the respective transceivers 134, 136 and branching filter circuit 140. Antennas 155 support communication via air interfaces, e.g., air interface 157, between communication device 100 and one or more base station(s) 160 utilizing one or more cellular technology that is supported by base station(s) 160.

According to one embodiment, the processor 105 can utilize network interface circuitry 125 to encode baseband signals for transmitting by front-end module 130 and to decode baseband signals received by front-end module 130 during signal transmission to and/or reception from a communication network. During signal communication, the front-end module 130 performs Radio Frequency (RF) modulation for high speed data transmission, converting between digital baseband signals and analog RF. The branching filter circuit 140 of the front-end module 130 connects each of first transceiver 134 and second transceiver 136 to at least one antenna 155 for transmitting and receiving signals. According to one implementation, branching filter circuit 140 performs a duplexing function whereby transmit signals are filtered and distributed to the at least one antenna 155 and received signals are filtered and distributed to the appropriate transceiver (134, 136). Branching filter circuit 140 can also perform diplexing (combining) of the transmit signals from the first and second transceivers 134, 136.

According to one embodiment, branching filter circuit 140 can employ tunable filtering to provide frequency selective coupling and impedance matching of radio frequency into and out of transceiver IC 132 and antennas 155. In an embodiment, tunable filter 145 can provide impedance matching to maximize power transfer of transmit signals from transceiver IC 132 to antennas 155 and receive signals from antennas 155 to transceiver IC 132. In another embodiment, tunable filter 145 can be employed to provide frequency selective attenuation to reduce intermodulation distortion (IMD) while performing the different signal transmissions capable of being provided by communication device 100. According to one or more embodiments, tunable filter 145 employs a capacitor in series with a high Q inductor in a band-stop arrangement, and the capacitor utilized within the tunable filter 145 is one of a MEMS capacitor or a MEMS capacitor bank within MEMS IC 150.

To support use of tunable filters 145, front-end module 130 can also comprise tunable controller functionality, which is illustrated as tunable filter controller 138. Additionally, to support and/or implement the various different functionalities described herein, MEMS IC 150 can be controlled by MEMS IC controller 152. MEMS IC controller 152 is shown located on transceiver IC 132; however, the actual location of MEMS IC controller 152 can vary by design. Thus, communication device 100 provides that in at least one alternate embodiment, MEMS IC controller 152 can be located within network interface circuitry 125. Alternatively, rather than a hardware controller implementation, the functionality of MEMS IC controller 152 can be encoded within MEMS IC control utility 114, which executes on a processor of processor 105 to generate the required power cycling and other control functions associated with MEMS IC 150.

With the hardware implementation, MEMS IC controller 152 can be a separate functional block having an integrated processor within front-end module 130. For example, MEMS IC controller 152 can be implemented via execution of firmware (e.g., utility 114) stored within non-volatile storage (not shown) located on front-end module 130. Execution of that firmware can then be completed via a dedicated processor also on front-end module 130. Alternatively, MEMS IC controller 152 can be a functional utility executed by DSP 139 within network interface circuitry 125, or the functionality can be provided via execution by processor on processor 105 of MEMS IC control utility 114 within memory 110. Other implementations of MEMS IC controller 152 are also possible. According to one aspect of the disclosure, one or both of tunable filter controller 138 and MEMS IC controller 152 controls capacitive tuning operations for impedance matching of at least one antenna 155.

Figure 2:
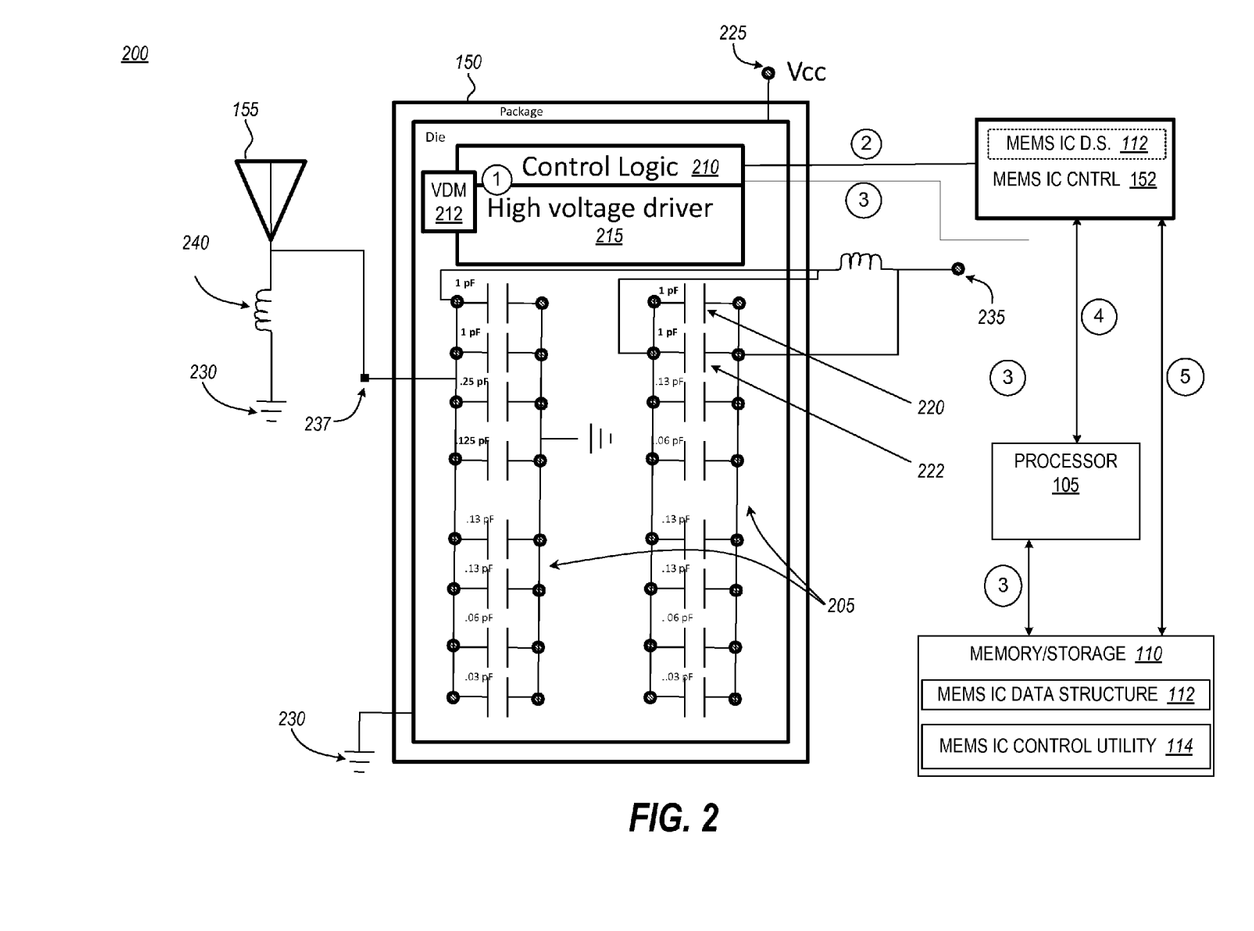
FIG. 2 provides an example schematic diagram of a MEMS IC with on-chip and off-chip controllers, and a processor-controlled implementation for reducing occurrences of stiction in a MEMS IC within a communication device, according to one or more embodiments.

Turning now to FIG. 2, there is provided a detailed illustration of an example antenna tuning subsystem 200 including example MEMS IC 150 connected with antenna 155 and separate MEMS IC controller 152. MEMS IC 150 is an integrated circuit chip comprising a semiconductor package and a die on which the functional components are fabricated. Those skilled in the art are familiar with the make-up and design of semiconductor ICs. MEMS IC 150 includes a plurality of capacitors arranged in banks 205, of which two banks are illustrated. Within this configuration of MEMS IC 150, each capacitor within the plurality of capacitors has a voltage terminal (not shown) for applying an actuation voltage to the individual capacitor, and as such, each capacitor is capable of being individually cycled. Of the plurality of capacitors, example first capacitor 220 and second capacitor 222 are presented and will be utilized during the description of the functional aspects of the disclosure. It is appreciated that other capacitors can be similarly cycled, a different pairing of capacitors can be cycled (e.g., capacitors across different banks), and/or that more than a single capacitor can be actuated within MEMS IC 150 at any given time. Use of a two capacitor embodiment is solely to allow for clarity in the description which follows.

MEMS IC 150 also includes control logic 210, a voltage distribution mechanism (VDM) 212, and high voltage driver 215. MEMS IC 150 also includes a supply voltage terminal 225 at which input power is received for powering the device and a ground connection 230. High voltage driver 215 receives the input voltage (Vcc) and generates the actuation voltages for operation of each capacitor within MEMS device 150. High voltage driver 215 is coupled to an on-chip voltage distribution mechanism 112 that couples to the voltage terminal of each of the plurality of capacitors to enable high voltage driver 215, based on input from control logic, to selectively provide a pre-determined voltage input required to actuate and charge a selected one or more of the plurality of capacitors. Control logic 210 is communicatively coupled to high voltage driver 215. During periods of active operation of MEMS IC 150, control logic 210 deterministically applies cycle times, which are less than a stiction limit, for an actuation and de-actuation of at least a first capacitor of the plurality of capacitors in order to substantially reduce an occurrence of stiction within at least the first capacitor during operation of the MEMs device. In one embodiment, the voltage distribution mechanism 112 is a switch.

As further presented by antenna tuning subsystem 200, MEMS IC 150 includes at least one transceiver-side terminal 235 for coupling the actuated capacitor within a signal propagation path of a transceiver (134, 136, FIG. 1) of a communication device, and at least one antenna-side terminal 237 for coupling an actuated capacitor of the MEMs IC in series, to an antenna 155. When connected in series between the antenna 155 and the transceiver (not shown), the actuated capacitor (e.g., first capacitor 220) of the MEMs IC 150 provides a specific capacitance value that is proximate to a capacitance required for tuning an antenna of the communication device (FIG. 1) to provide an acceptable level of signal communication quality. Antenna 155 is shown coupled to ground 230 via an inductor 240 to assist with signal tuning, as known to those skilled in the art.

In an alternative embodiment (not shown), MEMs IC 150 includes one terminal for coupling to the actuated capacitor, within a signal propagation path of a transceiver (134, 136, FIG. 1) or the antenna 155, and a terminal for shunt coupling to ground 230. When connected in shunt between the antenna 155 or the transceiver 134 or 136 and ground, the actuated capacitor (e.g., first capacitor 220) of the MEMs IC 150 provides a specific capacitance value that is proximate to a capacitance required for tuning an antenna of the communication device (FIG. 1) to provide an acceptable level of signal communication quality.

According to one aspect of the disclosed embodiments, control logic 210 identifies a selected one of the plurality of capacitors to actuate and control the high voltage driver 215 to apply a supply voltage across the voltage terminal of the selected one of the plurality of capacitors in order to actuate the selected capacitor. Further, control logic 210 signals the high voltage driver 215 to remove the supply voltage from the voltage terminal of the selected capacitor following a pre-determined time interval after actuation, in order to de-actuate the selected capacitor prior to an occurrence of stiction in the selected capacitor.

As one methodology for performing the above stiction avoidance by deterministically applying cycle times for actuation and de-actuation of a capacitor, control logic 210 actuates the first capacitor to provide a corresponding first capacitance; and concurrently with the actuating of the first capacitor, control logic 210 initiates a timing mechanism to track an elapsed time during which the first capacitor remains in an actuated state. Then, control logic 210 compares the elapsed time for which the first capacitor remains in the actuated state to a pre-determined stiction avoidance threshold actuation time for the first capacitor and, in response to the elapse time reaching the pre-determined threshold time, de-actuates the first capacitor. According to one aspect of the disclosure, the pre-determined stiction avoidance threshold actuation time is less than a time required for stiction to occur within the first capacitor. Further, each individual capacitor of the plurality of capacitors has a specific stiction avoidance pre-determined threshold time assigned for cycling through an actuation of the individual capacitor followed by a de-actuation of the individual capacitor to avoid an occurrence of stiction within the individual capacitor.

One aspect of the disclosure involves a design component that involves performing specific tests on the specific capacitors fabricated on the MEMS IC to evaluate what is the point of stiction for that specific capacitor. This process can include the use of known or experimentally determined characteristics of the capacitors and/or the MEMS IC under certain fabrication and/or operating conditions. These operating conditions can include, but are not limited to, the applied voltage for the specific capacitor, the types of load for which the device and/or the capacitor is being utilized, the ambient temperature in which the device will be operated or to which the device will be exposed, the signal magnitude or power level of signals transmitted from transceiver IC 132, and others. According to one embodiment, which is described further with referenced to FIG. 4, the stiction avoidance threshold values are pre-established and along with other parameters associated with the capacitors and/or the stiction avoidance processes are programmed/stored within a data structure, such as table 400.

According to one or more embodiments, the pre-established stiction avoidance threshold time of the individual capacitor is less than the stiction limit for that capacitor, and the stiction avoidance threshold time indicates when the individual capacitor has to be de-actuated to prevent stiction. As stated, this stiction avoidance threshold is stored within a data structure that identifies each capacitor and associates with an identified capacitor certain information including (1) the pre-determined threshold time for avoidance of stiction and (2) at least one other capacitor which can be cycled on to provide specific responses of the MEMS device following a cycling off of the identified capacitor.

Figure 3:
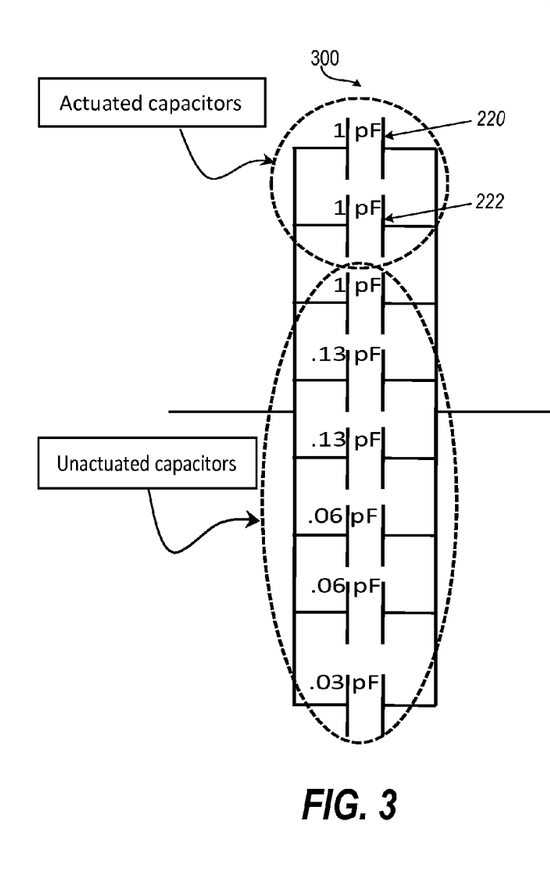
FIG. 3 provides an example bank of capacitors within a MEMS IC that can be deterministically actuated and de-actuated to avoid the occurrence of stiction while providing steady capacitance, according to one or more embodiments.
Figure 4:
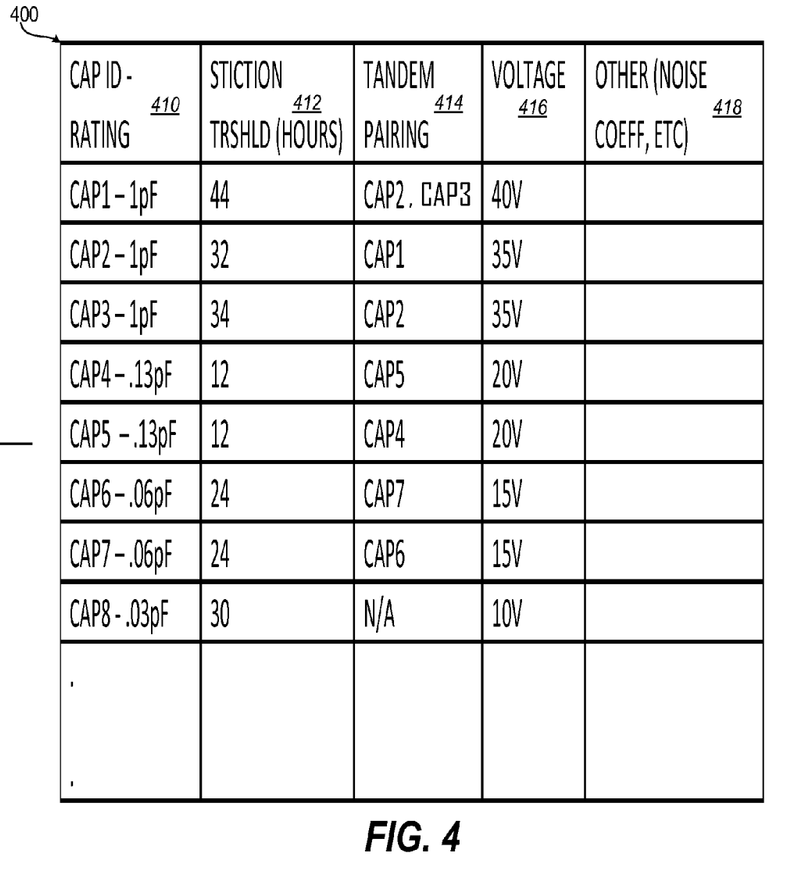
FIG. 4 illustrates an example data structure in the form of a table within which is maintained various parameters of the capacitors within a MEMS IC that allow a controller to provide specific power cycles to each capacitor and prevent the occurrence of stiction, in accordance with one or more embodiments.

Turning specifically to FIGS. 3 and 4, there are illustrated an example mapping in the form of table 400 (FIG. 4) for the capacitors of a single bank 300 of capacitors (FIG. 3) within example MEMS IC 150. Within the bank 300 of capacitors, a first capacitor 220 and a second capacitor 222 are indicated as being actuated. Each other capacitor within the bank 300 is indicated as being unactuated. The two actuated capacitors are both rated as 1 pF capacitors, and the remaining capacitors are each assigned its specific capacitance rating. Table 400 is an example data structure 112 (FIGS. 1 and 2). As presented, table 400 includes several columns of data or information, including capacitor identifier column 410, stiction threshold column 412, tandem pairing column 414, applied voltage column 416, and general other column 418. The general other column 418 represents a place holder for any number of additional parameters that can be stored within table 400 for the specific capacitor reference in the associated row of table 400.

Within the capacitor ID column 410 is also presented the capacitance or rating of the capacitor. The stiction threshold is presented in number of hours, but it is appreciated that the values and units are variable based on the type of capacitor and the actual amount of time required for stiction to occur in that capacitor. Depending on design, the stiction threshold values can be derived as a fixed amount of time (e.g., 2 hours) before stiction occurs for that capacitor or after a percentage of elapsed time (e.g., at 80%) before stiction occurs. Thus, for example, with first capacitor 220, assuming stiction occurs after five (5) days of continuous actuation, the stiction threshold can be programmed or pre-set as four (4) days or alternatively as 80%. Use of the percentage allows for an across the board single parameter as a multiplier for each capacitor, but involves some in-operation, real-time, calculation if the actual threshold values are not preset within the table 400. Tandem pairing refers to an identification of a second capacitor or a grouping of capacitors to actuate at the time the first capacitor is de-actuated. As further described herein, this paring allows for the continued operation of the device with only negligible effects, if any, being experienced by a connected device during operation. When a grouping of capacitors are provided as the tandem pairing to a first capacitor, that grouping is pre-selected such that the grouping provides similar capacitance as the first de-actuated capacitor, and this grouping is then identified within data structure 400. Voltage data within voltage column 416 refers to the level of voltage applied across the capacitor to charge the capacitor. While different voltages are shown, other embodiments may allow for a single voltage to be utilized for all capacitors.

Returning to FIG. 2, with the above data from table 400 available during operation, control logic 210 accesses the relevant data for each activated capacitor and periodically compares an actuation period of a currently active capacitor with the pre-determined threshold time. In response to the actuation period of the currently active capacitor approaching the pre-determined threshold time: control logic 210 accesses the data structure and identifies, from within the data structure, which other capacitor can or should be actuated following de-actuation of the currently active capacitor to enable the MEMs device to provide a specific capacitive response desired. With the tandem paired capacitor identified, control logic 210 retrieves from the data structure the pre-determined threshold time for the other capacitor and actuates the other capacitor from among the plurality of capacitors, in response to de-actuating the first capacitor. According to one or more embodiments, control logic 210 comprises logic that intelligently selects the second capacitor based on at least one of (a) a current operating condition of the communication device, (b) the acceptable level of signal communication quality, (c) a known capacitance of the second capacitor relative to the first capacitance corresponding to the first capacitor, and (d) a pre-identified pairing of the first capacitor and the second capacitor for selective cycling to avoid stiction.

According to one or more embodiments, the de-actuation of the first capacitor and actuation of the second capacitor occurs in sequence such that a total capacitance change during cycling of the capacitors is minimized. This sequential cycling of capacitance is provided in order to (1) minimize antenna detuning and interference with the data transmission and communication being performed by the communication device and (2) allow for uninterrupted transmission and reception of signals via the communication device. Each active capacitor within the plurality of capacitors of the MEMs device that is utilized during operation of the communication device is cycled one at a time to minimize detuning of the communication device, while preventing stiction of the active capacitor. Further, in one or more embodiments, control logic 210 triggers actuation of the second capacitor in an overlapping time period while the de-actuation of the first capacitor is being performed such that the at least one antenna remains tuned on a current operating frequency.

According to one or more aspects of the disclosure, control logic 210 can also provide a device level power cycling. The operation of this device-level power cycling can be implemented as an alternative to the above described individual capacitor-based stiction avoidance in one embodiment, or as an additional methodology to further extend the useful life of all the capacitors and the MEMS IC as a whole, in the described embodiments. With this aspect, in addition to deterministically applying cycle times for an actuation and de-actuation of active capacitors within MEMS IC, control logic 210 further activates a periodic timer having a timer cycle that is less than a time required for any active MEMS capacitor to experience stiction. Control logic 210 monitors the actuation and de-actuation for each MEMs capacitor during each cycle. Control logic 210, in response to the periodic timer reaching an end of a current timer cycle, detects a period of inactivity during which the MEMs device is not being utilized to support any activity of connected components (e.g., no signal communication via the attached antenna or transceivers). During this period of inactivity, the MEMs capacitors are not actively supporting any communication activity and/or the MEMs capacitors have not registered significant movement for a pre-set period of time. Then, control logic 210, in response to detecting the period of inactivity, places the MEMs device in a power cycle service mode during which all MEMS capacitors are powered down and de-actuated. According to one embodiment, the powering down of an active MEMS capacitor is performed if no previous powering down of the MEMS capacitor has occurred during the cycle.

Figure 5:
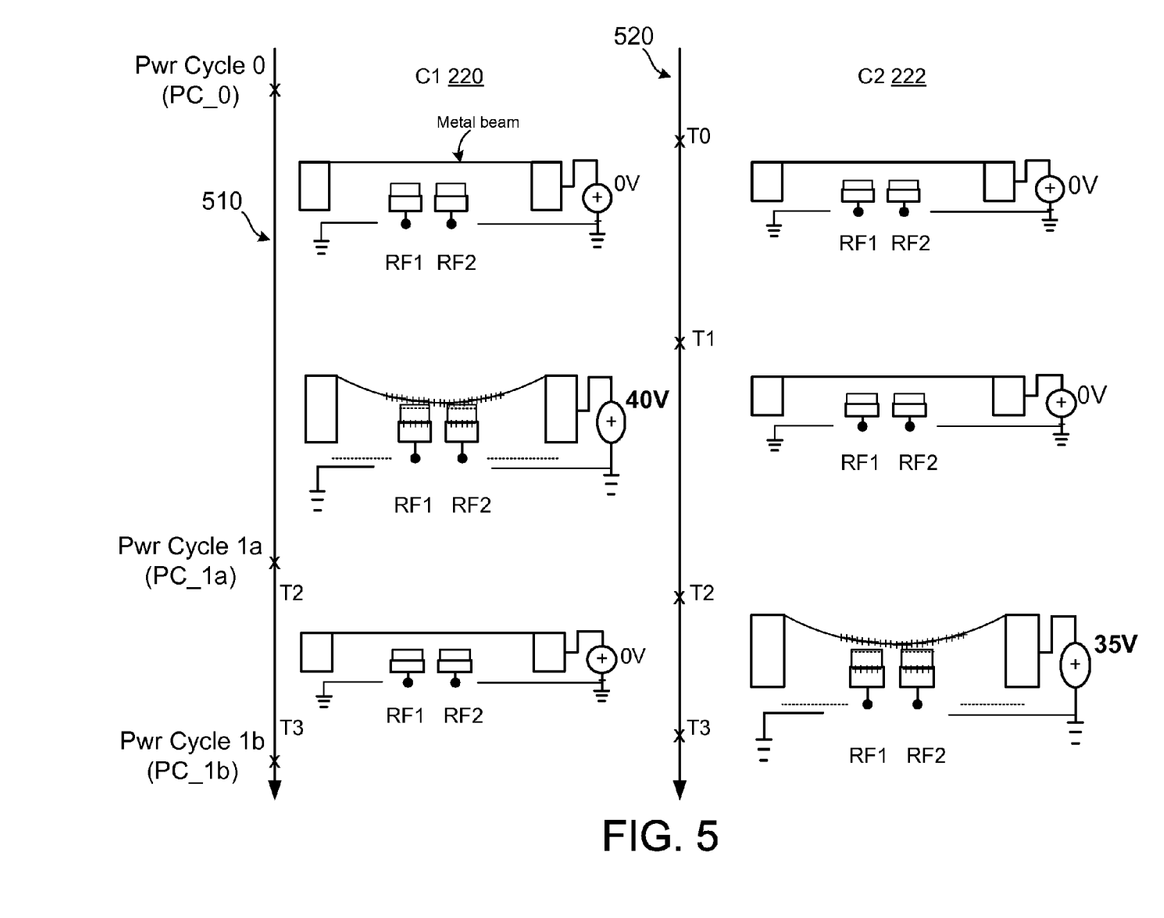
FIG. 5 provides a timing sequence illustrating the programmatic cycling off and on of two capacitors of a MEMS IC operating in tandem to provide near constant capacitive effects for an attached load, according to one or more embodiments.

FIG. 5 illustrates an example power cycling sequence for two capacitors within MEMS IC 150. For purposes of the description, the two capacitors are first capacitor 220 and second capacitor 222, and these capacitors are assumed to operate in tandem to provide continuous capacitance to a connected load and/or within a device in which the MEMS IC 150 is connected. Two timelines are indicated by the vertical, top to bottom arrows. The first is MEMS IC power cycle timeline 510 and the second is first capacitor stiction avoidance timeline 520. An actuation status of both the first capacitor (C1) 220 and the second capacitor (C2) 222 is indicated at the specifically enumerated times along first capacitor stiction avoidance timeline 520. According to the example, the length of time between T1 and T3 on stiction avoidance timeline 520 represents the amount of time required for stiction to occur on C1 220 such that the metal beam remains permanently distended towards RF1 and RF2. Based on pre-design analyses, presumably, if C1 220 remains actuated from T1 to T3, C1 220 will experience stiction. T2 then represents the stiction avoidance threshold for C1 220. The actual location of T2 can vary anywhere between T1 and T3, but cannot be at or after T3. Ideally, T2 is such that T2 does not approach T3 in case the particular capacitor has some variation in its stiction timeline.

At time T0, C1 220 and C2 222 are both inactive, i.e., no supply voltage is being applied across either capacitor. The metal beam is shown in a resting state above the bottom plates RF1 and RF2. No pull is asserted on the beam because there is no voltage being applied to either capacitor. At time T1, a high voltage (40V) is applied across the terminals of C1 220, and the metal beam begins to be deflected due to a positive charge accumulation on the beam relative to the negative charge build up within the dielectric material above the plates RF 1 and RF2. At time T2, which represents the stiction avoidance threshold time for C1 220, control logic 210 triggers high voltage driver 215 to remove the applied power from C1 220. Concurrently or sequentially, control logic 210 triggers high voltage driver to apply a required voltage across C2 222 to actuate C2 220, and control logic 210 sets the appropriate T2 value for C2 222. At time T3, C2 222 is actuated and the metal beam is shown deflected by the dielectric charge on RF1 and RF2 of C2 220. However, at time T3, at which C1 220 would have otherwise experienced stiction, C1 220 has no applied voltage and the metal beam returns to its preferred original position. Control logic 210 has therefore prevented stiction form occurring with C1 220.

Turning now to MEMS IC power cycle timeline 510, control logic 210 sets the periodicity of the power cycle timer to a set cycle, e.g., every 4 days at midnight. This setting can be pre-programmed and/or deduced based on detected periods of inactivity during operation of the device over a period of time. In one embodiment, the power cycle time can also be modified or updated by the control logic 210 as the detected periods of inactivity changes for the device. Power cycle timeline 510 is indicated with three power cycle times, Power cycle 0 (PC_0), which is a last successful power cycle, followed by PC_1a and PC_1b. PC_1a and PC_1b represent two different times at which a next power cycle can be implemented. Notably, PC_1b is a time after T3, and as such, use of the MEMS IC power cycle timeline by itself would not prevent stiction occurring on C1 220. However, PC_1a occurs prior to T3, and the power down cycle would necessarily de-actuate C1 220 and C2 220 (if actuated), thus preventing station from occurring on C1 220. Use of the power cycle timeline 510 by itself to perform stiction avoidance requires the power cycles to be frequent enough such that all capacitors within MEMS IC have a time measure between actuation and the occurrence of stiction that is larger than the time span between each power down cycle.

The above descriptions have been presented from the perspective of the control logic 210 on MEMS IC 150 containing all of the intelligence (program code and data structure 112 or table 400) necessary to perform the above described processes. However, multiple different embodiments are presented by FIG. 2, in which the control logic 210 is triggered to provide certain of the described features and/or functions by execution of an external controller or processor, which performs the other features and/or functions. As illustrated, in a first embodiment, the controlling operations can be performed by, MEMS IC controller 152, which is a microcontroller located external to MEMS IC 150 and communicatively coupled to control logic 210. As shown, in one embodiment, MEMS IC controller 152 can include MEMS IC data structure 112 for use in determining the de-actuation timing for actuated capacitors and the selection of second capacitors to actuate when the first capacitor is de-actuated. MEMS IC controller 152 can also provide the control functions related to the timing of the periodic power cycling of the entire MEMS IC 150. Thus, MEMS IC controller 152 can include the required timers to perform these timing functions. With this embodiment and/or system configuration, control logic 210 is communicatively coupled to the MEMS IC controller 152 and to the high voltage driver 215 and, in response to receiving at least one control signal from the MEMS IC controller 152, deterministically applies cycle times, less than a stiction limit, for an actuation and de-actuation of at least a first capacitor of the plurality of capacitors to substantially reduce an occurrence of stiction within at least the first capacitor during operation of the MEMs device 150.

As yet another embodiment, the functions described as being performed by MEMS IC controller 152 can be processor-executed functions, where the MEMS IC controller is implemented as a software module, such as MEMS IC control utility 114, executing on processor 105. Thus, control of MEMS IC 150 and in particular the power cycling of individual capacitors and/or the entire MEMS IC 150 can be performed at the system level, in one embodiment. The circled reference numerals indicate several different paths by which the control structure for MEMS IC 150 can be implemented. Path 1 indicates all control functions originating at control logic 210, which provides direct control over high voltage driver 215. Path 2 indicates at least some of the control functions originating from MEMS IC controller 152 and triggering certain operations by control logic 210. Path 3 indicates at least some of the control functions originating from processor 105 and triggering certain operations by control logic 210. Paths 4 and 5 are hybrid versions of Path 2, where the MEMS IC controller 152 receives some control signals from processor 105 and/or accesses system memory 110 to retrieve MEMS IC data structure 112 or other processing code. Other possible implementations can be possible depending on the actual type of device in which the MEMS IC 150 is being utilized.

As described above within the description of FIG. 1 and illustrated by the extended system figure of FIG. 2, MEMS IC 150 is located within communication device 100, and the control logic 210 receives control signals from the controller. These signals indicate what capacitance is required for a current operating condition of the communication device, and the control logic 210 selectively provides the required capacitance via cycling through actuation and de-actuation of specific ones of the plurality of capacitors based on the pre-determined time interval for each capacitor being utilized. With this embodiment involving the MEMS IC controller 152, microcontroller performs the above described functions related to tracking the timing of actuation and triggering de-actuation of capacitors to enable stiction avoidance. Thus, MEMS IC controller 152, in order to enable the control logic to apply cycle times for actuation and de-actuation: identifies a selected capacitor of the plurality of capacitors as a first capacitor to actuate and triggers actuation of the selected first capacitor to provide a corresponding first capacitance. Further, concurrently with actuating the first capacitor, MEMS IC controller 152 initiates a timing mechanism to track an elapsed time during which the first capacitor remains in an actuated state, and MEMS IC controller 152 periodically compares the elapsed time for which the first capacitor remains in the actuated state to a pre-determined threshold actuation time for the first capacitor. Then, in response to the elapse time reaching the pre-determined threshold time, MEMS IC controller 152 triggers the control logic to de-actuate the first capacitor, and in response to de-actuating the first capacitor, actuate a second capacitor from among the plurality of capacitors. Also in this embodiment, the controller performs the intelligent selection of the second capacitor, as described above. The other features and functionality can also be performed by MEMS IC controller 152.

Figure 6:
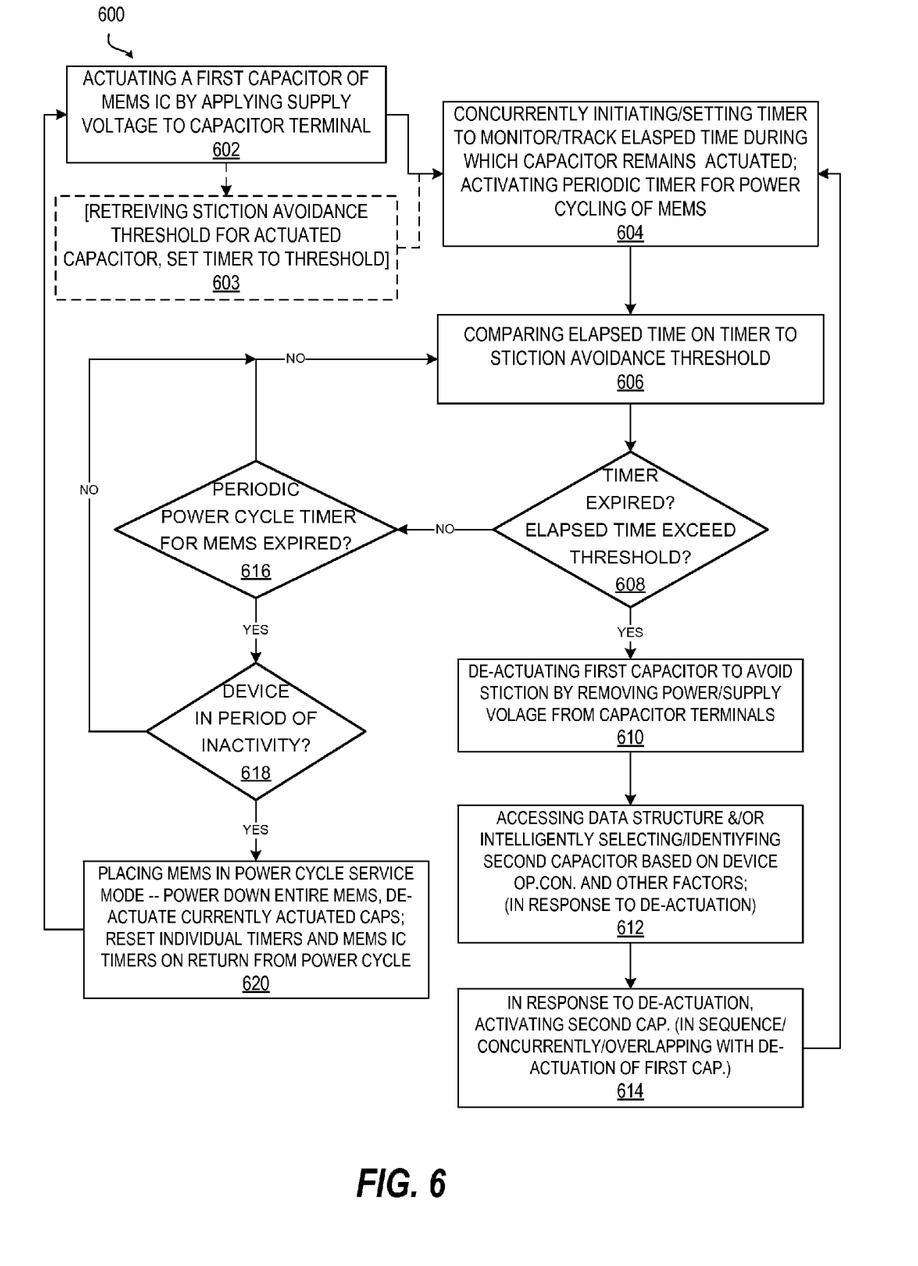
FIG. 6 is a flow chart illustrating the method by which capacitors within a MEMS IC are power cycled to reduce and/or substantially eliminate the occurrence of stiction, according to one or more embodiments.

Referring now to FIG. 6, there is depicted a method 600 for reducing stiction and extending an effective life of capacitors within a micro-electromechanical switch (MEMS) device containing a plurality of capacitors. Aspects of the method can be performed by one or more of the control logic 210, MEMS IC controller 152, and/or processor 105, and the method 600 can be performed within example communication device 100 (FIG. 1) and/or antenna tuning system 200 of FIG. 2, according to one embodiment. Method 600 includes controlling, via a programmable controller, an actuation and de-actuation cycle time for at least a first capacitor among the plurality of capacitors in order to substantially reduce an occurrence of stiction within at least the first capacitor. As illustrated by block 602, controlling the actuation and de-actuation cycle time first includes: actuating the first capacitor to provide a corresponding first capacitance by applying supply voltage to the capacitor terminals. Method 600 includes, concurrently with the actuating of the first capacitor, initiating a timing mechanism to track an elapsed time for which the first capacitor remains in an actuated state (block 604). In one embodiment, this aspect of method 600 also includes retrieving stiction avoidance threshold parameter value for the actuated capacitor and setting the value of the timer or timing mechanism (block 603). Method 600 entails comparing the elapsed time for which the first capacitor remains in the actuated state to a pre-established stiction avoidance threshold time for the first capacitor that is less than a time required for stiction to occur within the first capacitor (block 606). At decision block 608, method 600 determines if the timer has expired and/or if the elapsed time since actuation of the capacitor equals or exceeds the stiction avoidance threshold. Method 600 further includes, in response to the elapse time being at least equal to the stiction avoidance threshold, de-actuating the first capacitor by removing the supply voltage from the capacitor (block 610).

At block 612, method 600 includes intelligently selecting a second capacitor based on at least one of (a) a current operating condition of the communication device, (b) the acceptable level of signal communication quality, (c) a known capacitance of the second capacitor relative to the first capacitance corresponding to the first capacitor, and (d) a pre-identified pairing of the first capacitor and the second capacitor for selective cycling to avoid stiction. In one embodiment, the second capacitor pairing is retrieved from a data structure and the method includes accessing that data structure to identify the second capacitor. Then, method 600 includes: in response to de-actuating the first capacitor, actuating the second capacitor from among the plurality of capacitors.

Returning to decision block 608, according to the illustrative embodiment when the elapsed time does not exceed the stiction avoidance threshold, method 600 further includes determining at block 616 if the periodic power cycle timer for the MEMS IC has expired. One embodiment of the method can include activating a periodic timer having a cycle that is less than a time required for an active MEMS capacitor to experience stiction and then monitoring the actuation and de-actuation for each MEMs capacitor during each cycle.

According to one embodiment, this power cycle timer is implemented to trigger a power down cycle when the device is most inactive, such as at night, or when the device goes into a sleep mode. In one embodiment, the processor detects that there is no data or voice communication and/or no movement of the device for a specific length of time, and the processor triggers the control logic 210 to place the MEMS capacitors into a servicing mode of power cycle, if the capacitor has not already been power cycled. As an example, the power down cycle can be set for once every four days or once every week. If the power cycle time has not expired, method 600 iterates back to block 606 to monitor for the elapsed actuation time reaching the stiction avoidance threshold for the actuated capacitor. However, in response to the power cycle timer having expired (i.e., the timer reaching an end of a current cycle), method 600 includes determining at block 618 whether a period of inactivity is detected during which the MEMs device is not being utilized to support any external activity. In this scenario, the MEMs capacitors are not actively supporting any communication activity and/or the MEMs capacitors have not registered significant movement for a pre-set period of time. If there is activity occurring, the method 600 returns to block 606 and iterates until one of the decisions made at either block 608 or block 618 yields a positive result. In response to detecting the period of inactivity, method 600 includes placing the MEMs device in a power cycle service mode during which each MEMS capacitor is powered down and de-actuated (block 620) until the device becomes active again. In one embodiment, a capacitor is only power cycled if no previous powering down of the MEMS capacitor has occurred during the current cycle.

In the above flow chart, certain processes and/or functions of the method can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

Aspects of the present innovation are described below with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

While the innovation has been described with reference to exemplary embodiments, it will be understood by those skilled in the art that various changes may be made and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description, but is not intended to be exhaustive or limited to the innovation in the form disclosed. Many modifications and variations will be apparent to those of ordinary skill in the art without departing from the scope and spirit of the innovation. The embodiment was chosen and described in order to best explain the principles of the innovation and the practical application, and to enable others of ordinary skill in the art to understand the innovation for various embodiments with various modifications as are suited to the particular use contemplated.

What is claimed is:

1. A method for reducing stiction and extending an effective life of capacitors within a micro-electromechanical Switch (MEMs) device containing a plurality of capacitors, the method comprising:
   controlling, via a programmable controller, an actuation and de-actuation cycle time for at least a first capacitor among the plurality of capacitors in order to substantially reduce an occurrence of stiction within at least the first capacitor, wherein said controlling includes:
   actuating the first capacitor to provide a corresponding first capacitance;
   concurrently with the actuating of the first capacitor, initiating a timing mechanism to track an elapsed time for which the first capacitor remains in an actuated state;
   comparing the elapsed time for which the first capacitor remains in the actuated state to a pre-established stiction avoidance threshold time for the first capacitor, wherein the pre-established stiction avoidance threshold time is less than a time required for stiction to occur within the first capacitor; and
   in response to the elapse time reaching the pre-established stiction avoidance threshold time, de-actuating the first capacitor.

2. The method of claim 1, wherein:
   actuating the first capacitor comprises applying a supply voltage across the first capacitor sufficient to power the first capacitor to provide a corresponding first capacitance;
   de-actuating the first capacitor comprises removing the supply voltage from the first capacitor; and
   controlling the actuation and de-actuation cycle time further comprises: in response to de-actuating the first capacitor, actuating a second capacitor from among the plurality of capacitors.

3. The method of claim 2, wherein:
   the MEMs device is located within a communication device and is coupled between a transceiver and at least one antenna of the communication device;

the corresponding first capacitance is proximate to a capacitance required for tuning an antenna of the communication device to provide an acceptable level of signal communication quality; and the method further comprises: intelligently selecting the second capacitor based on at least one of (a) a current operating condition of the communication device, (b) the acceptable level of signal communication quality, (c) a known capacitance of the second capacitor relative to the first capacitance corresponding to the first capacitor, and (d) a pre-identified pairing of the first capacitor and the second capacitor for selective cycling to avoid stiction.

4. The method of claim 3, wherein the de-actuation of the first capacitor and actuation of the second capacitor occurs in sequence such that a change in total capacitance experienced by the communication device during cycling of the capacitors is minimized in order to (1) minimize antenna detuning and interference with the signal transmission and reception being performed by the communication device and (2) allow for uninterrupted transmission and reception of signals via the communication device, wherein each active capacitor within the plurality of capacitors of the MEMs device that is utilized during operation of the communication device can be cycled one at a time according to a pre-programmed cycle timing schedule to minimize detuning of the communication device, while preventing stiction of the active capacitor.

5. The method of claim 3, wherein actuating the second capacitor comprises triggering actuation of the second capacitor to occur in an overlapping time period while the de-actuation of the first capacitor is being performed, such that the at least one antenna remains tuned on a current operating frequency of a signal being communicated through the transceiver.

6. The method of claim 1, wherein:
each individual capacitor of the plurality of capacitors has a specific pre-determined threshold time assigned for cycling through an actuation of the individual capacitor followed by a de-actuation of the individual capacitor to avoid an occurrence of stiction within the individual capacitor;
the pre-determined threshold time of the individual capacitor indicates when the individual capacitor has to be de-actuated to prevent stiction, and is stored within a data structure that identifies each capacitor and associates with an identified capacitor information including (1) the pre-determined threshold time for avoidance of stiction and (2) at least one other capacitor which can be cycled on to provide specific responses of the MEMs device following a cycling off of the identified capacitor; and
the method further comprises:
periodically comparing an actuation period of a currently active capacitor with the pre-determined threshold time;
in response to the actuation period of the currently active capacitor approaching the pre-determined threshold time: accessing the data structure and identifying, from within the data structure, which other capacitor should be actuated following de-actuation of the currently active capacitor to enable the MEMs device to provide a specific capacitive response desired; and retrieving from the data structure the pre-determined threshold time for the other capacitor.

7. The method of claim 1, wherein controlling the actuation and de-actuation cycle time comprises:

activating a periodic timer having a cycle that is less than a time required for an active MEMS capacitor to experience stiction;
monitoring the actuation and de-actuation for each MEMs capacitor during each cycle;
in response to the timer reaching an end of a current cycle:
detecting a period of inactivity during which the MEMs capacitors of the MEMs device are not being utilized to support any activity and have not registered significant movement for a period of time;
in response to detecting the period of inactivity, placing the MEMs device in a power cycle service mode during which each MEMS capacitor is powered down and de-actuated if no previous powering down of the MEMS capacitor has occurred during the cycle.

8. A capacitive micro-electromechanical switch (MEMs) integrated circuit (IC) comprising:
a plurality of capacitors, each capacitor having a voltage terminal for applying an actuation voltage to the individual capacitor, wherein each capacitor is capable of being individually cycled;
a high voltage driver having a voltage distribution mechanism that couples to the voltage terminal of each of the plurality of capacitors to enable the high voltage driver to selectively provide a pre-determined voltage input required to actuate and charge a selected one or more of the plurality of capacitors; and
control logic communicatively coupled to the high voltage driver and which deterministically applies power cycle times, less than a stiction limit, for an actuation and de-actuation of at least a first capacitor of the plurality of capacitors to substantially reduce an occurrence of stiction within at least the first capacitor during operation of the MEMs device.

9. The MEMs IC of claim 8, wherein the control logic further comprises logic that:
identifies a selected one of the plurality of capacitors to actuate;
controls the voltage driver to apply a supply voltage across a voltage terminal of the selected one of the plurality of capacitors in order to actuate the selected capacitor; and
signals the voltage driver to remove the supply voltage from the voltage terminal of the selected capacitor following a pre-determined time interval after actuation, in order to de-actuate the selected capacitor prior to an occurrence of stiction in the selected capacitor.

10. The MEMs IC of claim 8, wherein the control logic that deterministically applies cycle times for actuation and de-actuation includes logic that:
actuates a first capacitor to provide a corresponding first capacitance;
concurrently with the actuating of the first capacitor, initiates a timing mechanism to track an elapsed time during which the first capacitor remains in an actuated state;
compares the elapsed time for which the first capacitor remains in the actuated state to a pre-established stiction avoidance threshold time for the first capacitor, wherein the pre-established stiction avoidance threshold time is less than a time required for stiction to occur within the first capacitor;
wherein each individual capacitor of the plurality of capacitors has a specific pre-established stiction avoidance threshold time assigned for cycling through an actuation of the individual capacitor followed by a de-actuation of the individual capacitor to avoid an occurrence of stiction within the individual capacitor; and in response to the elapse time reaching the pre-established stiction avoidance threshold time, de-actuates the first capacitor.

11. The MEMs IC of claim 10, wherein:
the pre-established stiction avoidance threshold time of the individual capacitor is less than the stiction limit for that capacitor and indicates when the individual capacitor has to be de-actuated to prevent stiction, and is stored within a data structure that identifies each capacitor and associates with an identified capacitor information including (1) the pre-determined threshold time for avoidance of stiction and (2) at least one other capacitor which can be cycled on to provide specific responses of the MEMs device following a cycling off of the identified capacitor; and
the control logic further comprises logic that:
periodically compares an actuation period of a currently active capacitor with the pre-determined threshold time;
in response to the actuation period of the currently active capacitor approaching the pre-determined threshold time: accesses the data structure and identifies, from within the data structure, which other capacitor should be actuated following de-actuation of the currently active capacitor to enable the MEMs device to provide a specific capacitive response desired; and retrieves from the data structure the pre-determined threshold time for the other capacitor; and
actuates the other capacitor from among the plurality of capacitors, in response to de-actuating the first capacitor.

12. The MEMs IC of claim 11, further comprising:
at least one antenna-side terminal for coupling an actuated capacitor of the MEMs IC to an antenna;
at least one transceiver-side terminal for coupling the actuated capacitor within a signal propagation path of a transceiver of a communication device, wherein when connected between the antenna and the transceiver, the actuated capacitor of the MEMs IC provides a specific capacitance value that is proximate to a capacitance required for tuning an antenna of the communication device to provide an acceptable level of signal communication quality; and
the control logic further comprises logic that intelligently selects the second capacitor based on at least one of (a) a current operating condition of the communication device, (b) the acceptable level of signal communication quality, (c) a known capacitance of the second capacitor relative to the first capacitance corresponding to the first capacitor, and (d) a pre-identified pairing of the first capacitor and the second capacitor for selective cycling to avoid stiction.

13. The MEMs IC of claim 12, wherein the de-actuation of the first capacitor and actuation of the second capacitor occurs in sequence such that a total capacitance change during cycling of the capacitors is minimize in order to (1) minimize antenna detuning and interference with the data transmission and communication being performed by the communication device and (2) allow for uninterrupted transmission and reception of signals via the communication device, wherein each active capacitor within the plurality of capacitors of the MEMs device that is utilized during operation of the communication device is cycled one at a time to minimize detuning of the communication device, while preventing stiction of the active capacitor.

14. The MEMs IC of claim 12, wherein the control logic that de-actuates the first capacitor includes logic that triggers actuation of the second capacitor in an overlapping time period while the de-actuation of the first capacitor is being performed such that the at least one antenna remains tuned on a current operating frequency.

15. The MEMs IC of claim 12, wherein the control logic that deterministically applies cycle times for an actuation and de-actuation comprises logic that:
activates a periodic timer having a cycle that is less than a time required for an active MEMS capacitor to experience stiction;
monitors the actuation and de-actuation for each MEMs capacitor during each cycle;
in response to the timer reaching an end of a current cycle:
detects a period of inactivity during which the MEMs capacitors of the MEMs device are not being utilized to support any activity and have not registered significant movement for a period of time;
in response to detecting the period of inactivity, places the MEMs device in a power cycle service mode during which each MEMS capacitor is powered down and de-actuated if no previous powering down of the MEMS capacitor has occurred during the cycle.

16. A communication device comprising:
at least one transceiver circuit for transmitting and receiving signal communication;
at least one antenna;
a controller that controls capacitive tuning operations for the at least one antenna;
a capacitive micro-electromechanical switch (MEMs) integrated circuit (IC) coupled within at least one signal path of the at least one transceiver circuit and to the at least one antenna, the MEMs IC comprising:
a plurality of capacitors, each capacitor having a voltage terminal for applying an actuation voltage to the individual capacitor, wherein each capacitor is capable of being individually cycled;
a high voltage driver having a voltage distribution mechanism that couples to the voltage terminal of each of the plurality of capacitors to enable the high voltage driver to selectively provide a pre-determined voltage input required to actuate and charge a selected one or more of the plurality of capacitors; and
control logic communicatively coupled to the controller and to the high voltage driver and which, in response to receiving at least one control signal from the controller, deterministically applies power cycle times, less than a stiction limit, for an actuation and de-actuation of at least a first capacitor of the plurality of capacitors to substantially reduce an occurrence of stiction within at least the first capacitor during operation of the MEMs device.

17. The communication device of claim 16, wherein the control logic:
receives control signals from the controller, which signals indicates what capacitance is required for a current operating condition of the communication device and selectively provides the required capacitance via cycling through actuation and de-actuation of specific ones of the plurality of capacitors based on the pre-determined time interval for each capacitor being utilized;
controls the high voltage driver to apply a supply voltage across a voltage terminal of a selected one of the plurality of capacitors in order to actuate the selected capacitor; and
signals the voltage driver to remove the supply voltage from the voltage terminal of the selected capacitor following a pre-determined time interval after actuation, in order to de-actuate the selected capacitor prior to an occurrence of stiction in the selected capacitor.

18. The communication device of claim 16, wherein the controller, in order to enable the control logic to apply cycle times for actuation and de-actuation:
   identifies a selected capacitor of the plurality of capacitors as a first capacitor to actuate;
   triggers actuation of the selected first capacitor to provide a corresponding first capacitance;
   concurrently with actuating the first capacitor, initiates a timing mechanism to track an elapsed time during which the first capacitor remains in an actuated state;
   periodically compares the elapsed time for which the first capacitor remains in the actuated state to a pre-established stiction avoidance threshold time for the first capacitor, wherein the pre-established stiction avoidance threshold time is less than a time required for stiction to occur with the first capacitor;
   in response to the elapse time reaching the pre-established stiction avoidance threshold time:
      intelligently selects a second capacitor from among the plurality of capacitors based on at least one of (a) a current operating condition of the communication device, (b) the acceptable level of signal communication quality, (c) a known capacitance of the second capacitor relative to the first capacitance corresponding to the first capacitor, and (d) a pre-identified pairing of the first capacitor and the second capacitor for selective cycling to avoid stiction; and
      triggers the control logic to: de-actuate the first capacitor; and in response to de-actuating the first capacitor, actuate the selected second capacitor.

19. The communication device of claim 17, wherein:
   the de-actuation of the first capacitor and actuation of the second capacitor occurs in sequence such that a total capacitance change during cycling of the capacitors is minimize in order to (1) minimize antenna detuning and interference with the data transmission and communication being performed by the communication device and (2) allow for uninterrupted transmission and reception of signals via the communication device, wherein each active capacitor within the plurality of capacitors of the MEMs device that is utilized during operation of the communication device is cycled one at a time to minimize detuning of the communication device, while preventing stiction of the active capacitor; and
   the control logic that de-actuates the first capacitor includes logic that triggers actuation of the second capacitor while the de-actuation of the first capacitor is being performed, in an overlapping time period, such that the at least one antenna remains tuned on a current operating frequency.

20. The communication device of claim 16, further comprising:
   at least one persistent storage; and
   a data structure stored within the persistent storage and which identifies each capacitor and associates with an identified capacitor information including (1) the pre-determined threshold time for avoidance of stiction and (2) at least one other capacitor which can be cycled on to provide specific responses of the MEMs device following a cycling off of the identified capacitor, wherein the pre-determined threshold time of the individual capacitor indicates when the individual capacitor has to be de-actuated to prevent stiction; and
   the controller further comprises program logic that:
      periodically compares an actuation period of a currently active capacitor with the pre-determined threshold time;
      in response to the actuation period of the currently active capacitor approaching the pre-determined threshold time: accesses the data structure and identifies, from within the data structure, which other capacitor should be actuated following de-actuation of the currently active capacitor to enable the MEMs device to provide a specific capacitive response desired; and retrieves from the data structure the pre-determined threshold time for the other capacitor; and
      triggers the control logic to actuate the other capacitor from among the plurality of capacitors, in response to de-actuating the first capacitor.

* * * * *